United States Patent [19]

Schmid

[11] Patent Number: 5,195,644
[45] Date of Patent: Mar. 23, 1993

[54] SEALED, SEAMLESS BOX AND METHOD OF MANUFACTURING SAME

[75] Inventor: Hartmut Schmid, North Vancouver, Canada

[73] Assignee: Glenayre Electronics Ltd., Vancouver, Canada

[21] Appl. No.: 912,349

[22] Filed: Jul. 13, 1992

[51] Int. Cl.⁵ .............................................. B65D 5/40
[52] U.S. Cl. .......................................... 220/6; 220/7; 220/680; 229/190
[58] Field of Search .................. 220/6, 7, 677, 678, 220/679, 680; 229/190

[56] References Cited

U.S. PATENT DOCUMENTS

| | | | |
|---|---|---|---|
| H526 | 9/1988 | Miller | 361/424 |
| 748,020 | 12/1903 | Runtz | 229/190 |
| 1,239,162 | 9/1917 | Cullen | 229/190 |
| 1,305,605 | 6/1919 | Hunter | 220/680 |
| 1,731,111 | 10/1929 | Romer | 229/190 |
| 2,190,479 | 2/1940 | Moore | 229/190 |
| 2,961,478 | 11/1960 | Burns | 174/35 |
| 2,993,634 | 7/1961 | Wilkins | 229/190 |
| 3,283,058 | 11/1966 | Johnson, Jr. et al. | 174/35 |
| 4,056,221 | 11/1977 | Piltz et al. | 229/190 |
| 4,215,796 | 8/1980 | Johnston et al. | 174/35 R |
| 4,249,033 | 2/1981 | Darakjy et al. | 174/16 R |
| 4,331,285 | 5/1982 | Gottwals | 228/173 |
| 4,465,226 | 8/1984 | Flanagan | 229/190 |
| 4,572,426 | 2/1986 | Lisiecki | 229/190 |
| 4,757,909 | 7/1988 | Matsuura | 220/7 |
| 4,781,300 | 11/1988 | Long | 220/7 |
| 4,785,136 | 11/1988 | Mollet et al. | 174/35 R |

Primary Examiner—Joseph Man-Fu Moy
Attorney, Agent, or Firm—Christensen, O'Connor, Johnson & Kindness

[57] ABSTRACT

A sealed, seamless box (10) that forms an RF-wave- or gas-tight enclosure is disclosed. The box of this invention includes a box body (12) formed of a single metal sheet (23) with a base panel (16) and upwardly extending side panels (18). The side panels are provided with tabs (20) that are thinner than the basic metal sheet. The tabs are seated in complementary cutouts (22) formed in the adjacent side panels. The cutouts have a depth equal to the tabs so that the side panels have a substantially uniform thickness equal to the thickness of the basic metal sheet. The tabs are secured in place by pins (30) formed integrally with the tabs that extend into openings (32) formed in the portions of the adjacent side panels that define the cutouts.

24 Claims, 7 Drawing Sheets

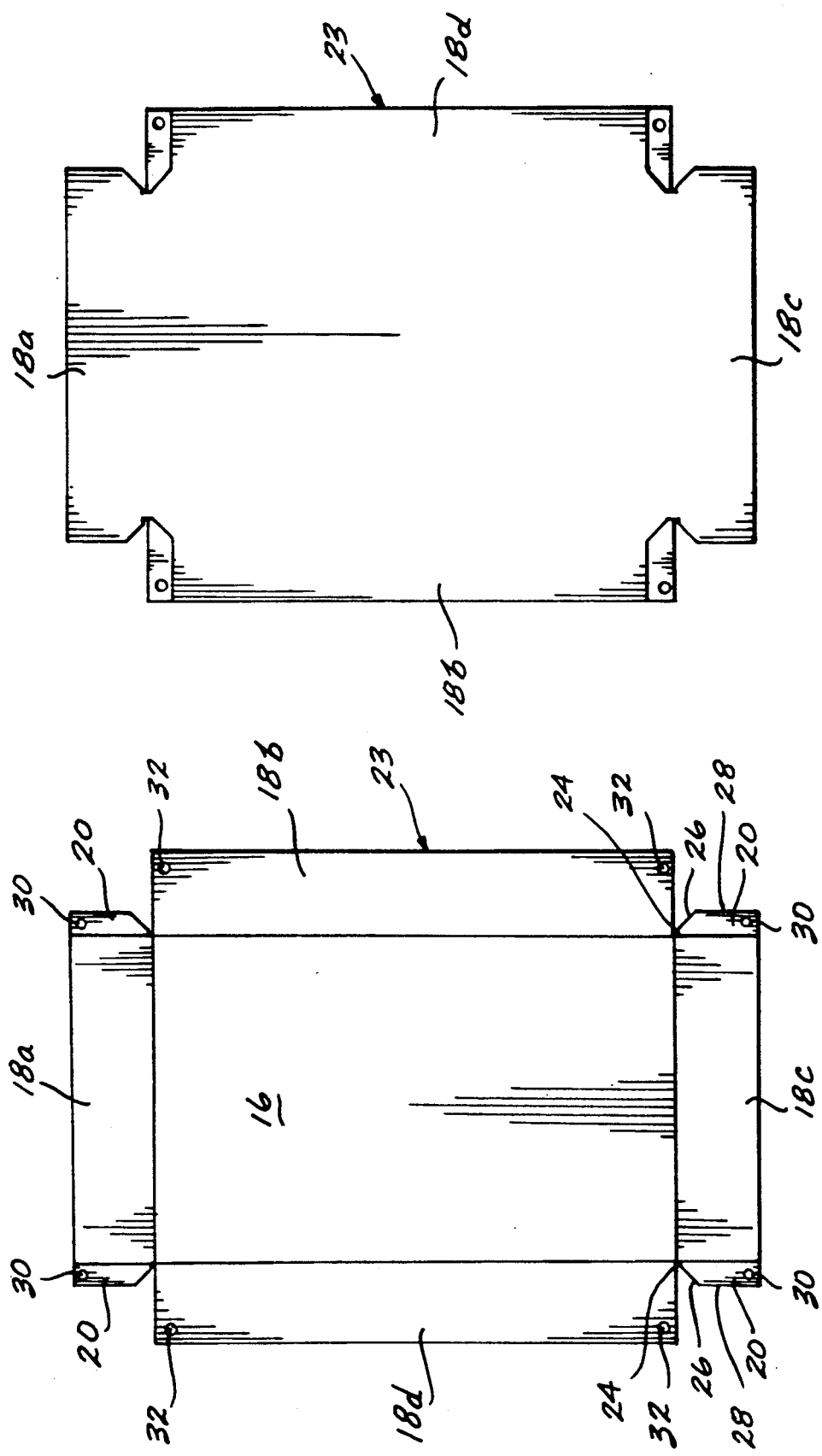

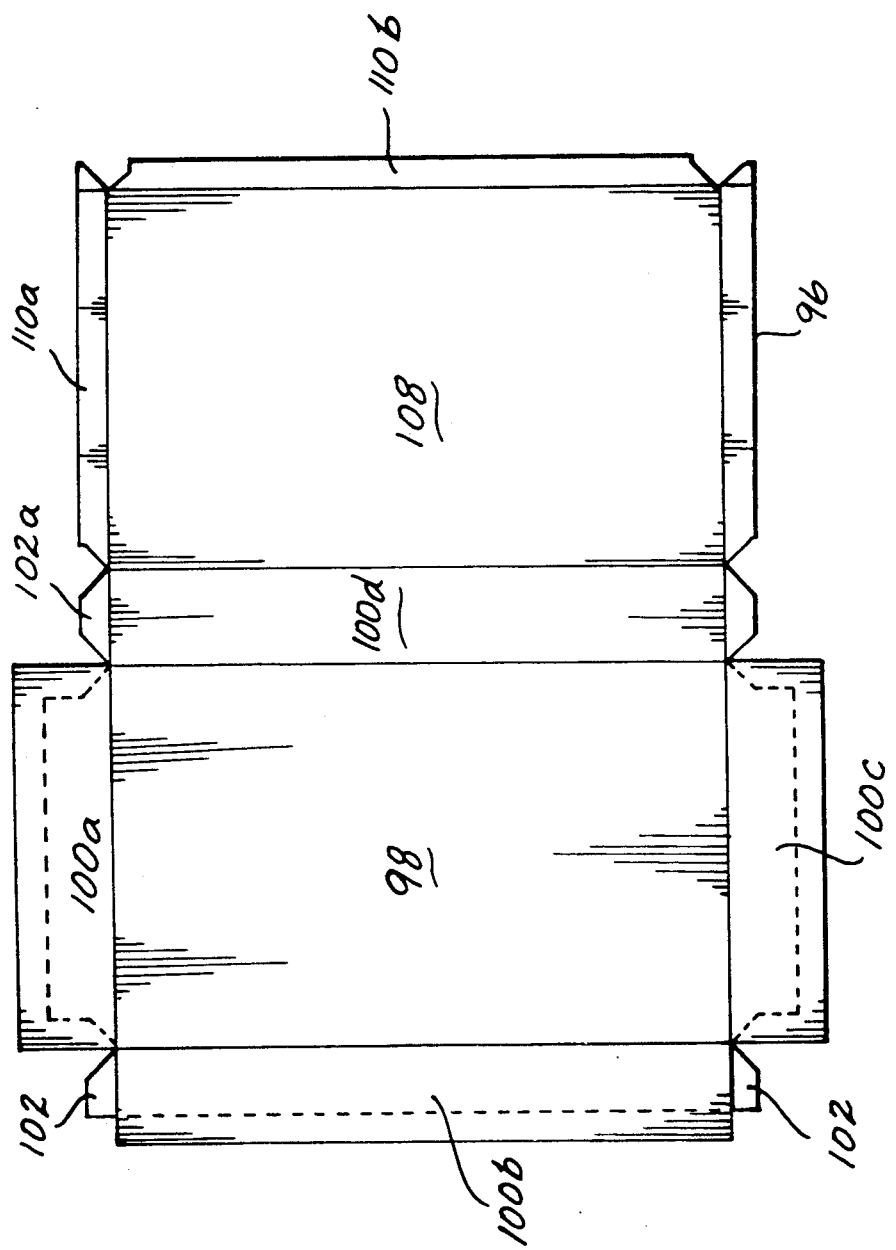

SEALED, SEAMLESS BOX AND METHOD OF MANUFACTURING SAME

FIELD OF THE INVENTION

This invention relates generally to sealed boxes used for housing electrical signal and chemical processing equipment and the like and, more particularly, to a sealed, seamless box and method of making same.

BACKGROUND OF THE INVENTION

Sealed boxes are used in a number of different fields of human endeavor to house components so that they are shielded from the surrounding environment. Certain electrical circuits, for example, are often housed in radiofrequency (RF) shielded boxes because either the circuits are adversely affected by ambient radio waves or they generate radio waves that could adversely effect surrounding electronic devices. Some chemical processing equipment, such as gas monitors, are likewise housed in sealed containers. This is because these monitors may include some type of burner and be in an environment with a high concentration of a combustible gas, where such a combustion can be dangerous. Many sealed boxes, and especially almost all RF-shielded boxes, are formed of metal, such as copper alloys or stainless steel.

When a typical box is assembled by the selective folding of a specifically shaped sheet of metal, seams are formed along the lines where the sides of the box meet. These seams form openings, which, for a sealed box, must be closed or else they can function as holes between the space in the box and the surrounding environment. In order to close these seams, the sides of some sealed boxes are provided with tabs that wrap around the outer perimeter of the adjacent sides. A disadvantage of this construction is that the tabs form outwardly extending bulges along the outer surface of the box with which they are associated. Consequently, when a lid is placed over the body of the box, the bulges present an irregular surface that prevents the lid from properly sealing over the box body. Small openings are formed between the body and lid, reducing the sealed integrity of the box. This necessitates having to provide the box and/or the lid with some type of coupling mechanism to reestablish the desired RF- or gas-tight seal around the interface between the two parts of the box.

Other shielded boxes are provided with a double-walled structure in order to close off the openings formed by the interwall seams. This type of box has a set of inner and outer walls that are arranged so that the seams associated with the inner walls are offset from the seams associated with the outer walls. One disadvantage of this type of box is that, with its double-walled construction, it requires almost twice as much material to manufacture as other boxes. Moreover, the double walls of this box appreciably add to its overall weight. This reduces the attractiveness of installing the box on aeronautical and space vehicles and to other devices where an overall goal is to have a fixed weight as low as possible.

SUMMARY OF THE INVENTION

This invention relates to a seamless box that is well suited to provide an RF-shielded and/or gas-tight enclosure. The box assembly of this invention has a body that is formed from a single sheet of selectively shaped metal. The body includes a base section, which functions as the bottom of the box, and four outwardly extending sections that serve as the sides of the box. At the corners of the box where the side panels meet, one panel is provided with a tab that has a thickness less than that of the basic metal sheet. The adjacent panel defines a cutout that has a profile identical to the tab and a depth equal to the thickness of the tab. The tab is wrapped around the corner of the box so as to be seated in the complementary cutout. The tab is formed with a pin that extends through an opening in the adjacent side panel, locking the two side panels together.

One method of making the sealed box of this invention involves selectively etching a sheet of metal to simultaneously form the base panel, the side panels, the tabs, and the cutouts. Once the metal is formed, the side panels are bent upward. The tabs are wrapped around the adjoining side panels and sealed in the complementary cutouts. When the tabs are bent into position, the pins are inserted into the openings associated with the cutouts to hold the side panels with which the tabs are associated in place.

The tabs of the sealed box of this invention wrap around the box corners with which they are associated. Consequently, the corners do not have any seams. Moreover, the tabs themselves are disposed against the outer surface of the complementary side walls. Thus, the box of this invention does not have any internal seams or breaks through which stray radio waves, gas, or the like can enter or leave the box.

The tabs and complementary side panel cutouts of this box are formed so as to be of equal depth. Thus, when the box is assembled, the tabs are seated flush against the adjoining side panels. There are no irregular bulges that make it difficult to place a tight-fitting lid over the body of the box to form a totally sealed enclosure. Still another feature of this box is that, since the side panels, including the tabs, are formed of one thickness of basic metal sheet, the box itself is of minimal weight. Moreover, the body of this box is formed of only a single piece of metal. Consequently, the overall cost of the materials needed to manufacture the box of this invention is likewise relatively low.

BRIEF DESCRIPTION OF THE DRAWINGS

This invention is pointed out with particularity in the appended claims. The above and further advantages of the invention may be understood by referring to the following description, taken in conjunction with the accompanying drawings, in which:

FIG. 2 is a plan view of the unfolded sheet of metal used to form the box body of this invention, wherein this view depicts the side of the metal sheet that forms the inner surfaces of the box body;

FIG. 3 is a plan view of the unfolded sheet of metal used to form the box body of this invention, wherein this view is the side of the metal sheet that forms the outer surfaces of the box body;

FIG. 7 is a perspective view of an unfolded sheet of metal used to form the box body of FIG. 6, wherein this view depicts the side of the metal sheet that forms the inner surfaces of the box body;

FIG. 11 is a top view of an unfolded metal sheet used to form the box of FIG. 11 wherein this view depicts the side of the sheet that forms the inner surfaces of the box.

DETAILED DESCRIPTION OF THE PREFERRED EMBODIMENT

Figure 1:
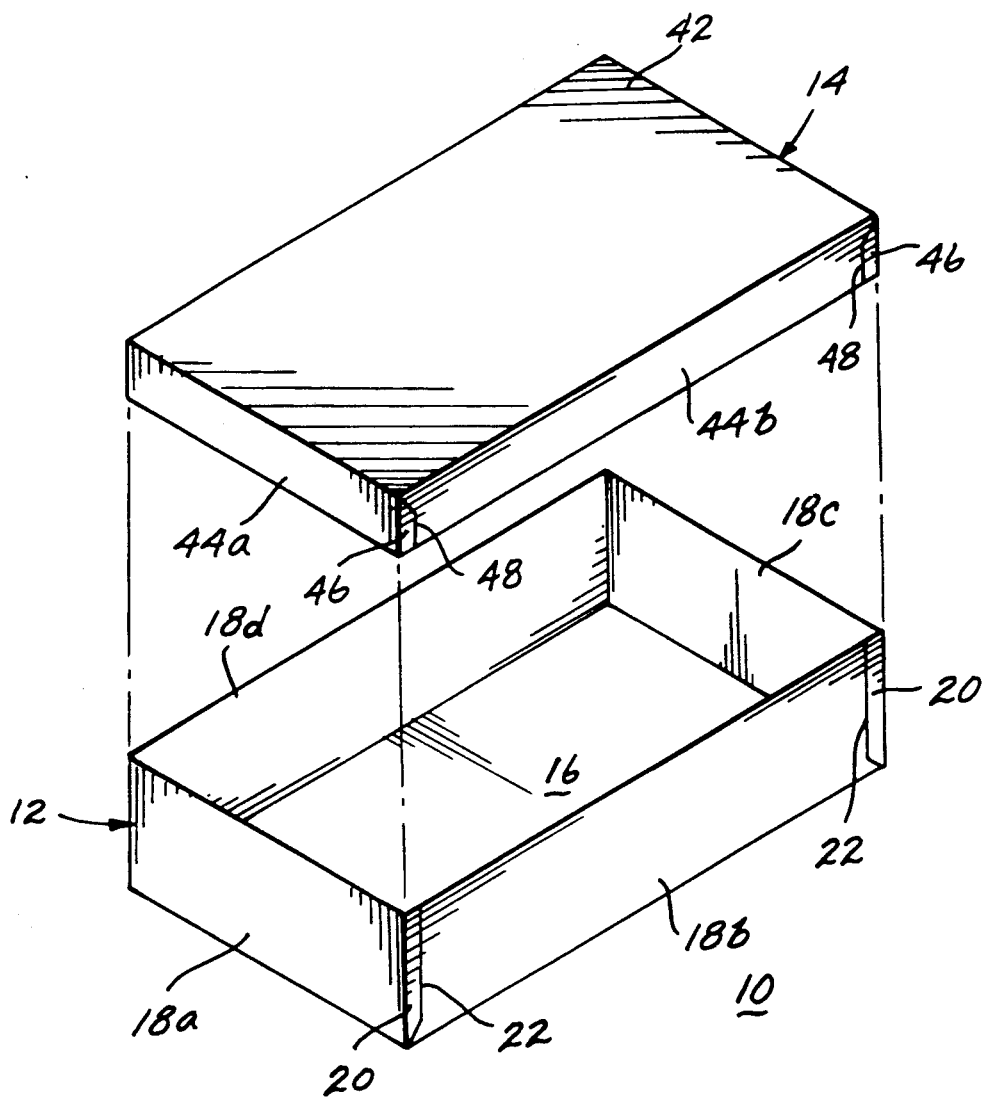
FIG. 1 is a perspective view of a body and lid that form the box assembly of this invention.

A sealed box 10 of this invention, as depicted by FIG. 1, includes a box body 12 and a box lid 14 designed to fit over the body so as to form a sealed enclosure. The body 12 is formed from a single sheet of metal that is selectively shaped and bent to form a base panel 16, which forms the bottom of the box 10, and four side panels 18a–18d, that form the lateral walls of the box 10. Tabs 20, which extend from the side panels 18, wrap around the longitudinal corners of the box body 12 and are seated in cutouts 22 formed in the outer surface of the adjacent side panels. The box lid 14, as will be discussed hereinafter, has the same general construction as the box body 12.

Figure 4:
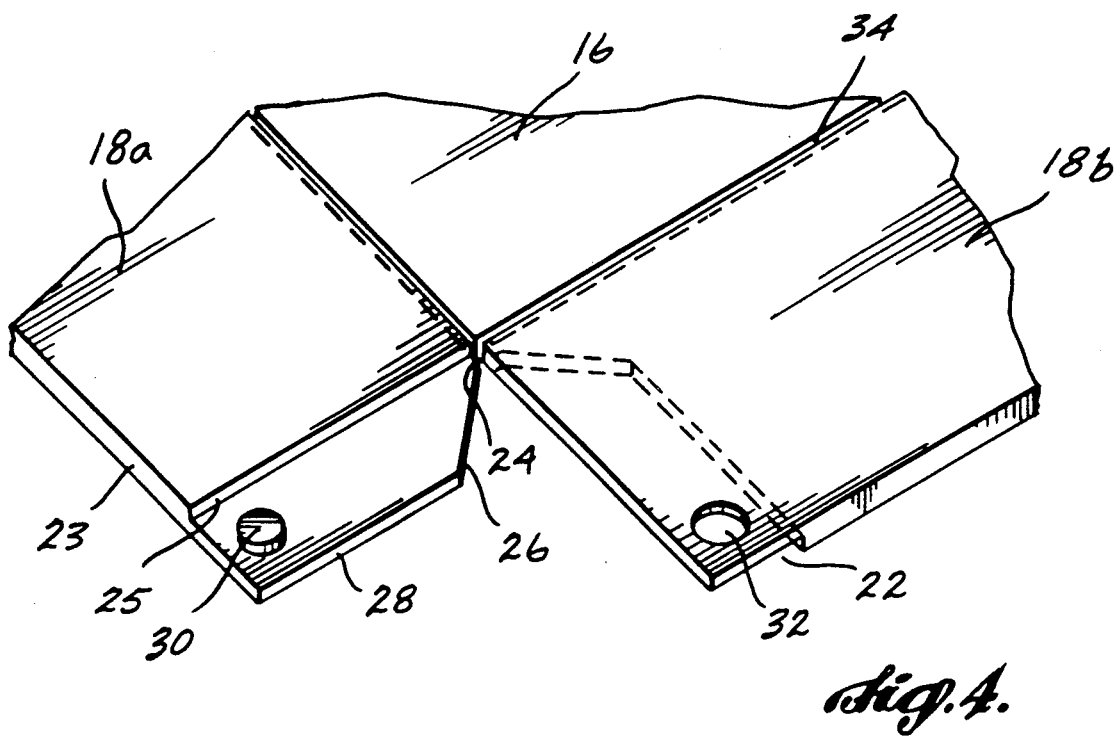
FIG. 4 is a detailed view of a pair of unfolded side panels that form the corners of the box body of this invention.

FIGS. 2–4 illustrate a metal sheet 23 from which the box body 12 of this invention is formed. In one version of the box 10 of this invention made to serve as an RF-shielded enclosure and that has a size of approximately 3×6×1 inches, the metal sheet 23 is a brass sheet that is between approximately 0.2 and 2.0 mm thick, and in some more preferred versions of the invention, approximately 0.4 mm thick. The metal sheet 23 is shaped to have a rectangular center section that forms the body base panel 16 and four rectangular side sections that form the box side panels 18. In the illustrated version of the invention, the opposed side panels 18a and 18c that define the width of the box are each provided with two tabs 20. The tabs 20 extend from the opposed longitudinal edges of the panels 18a and 18c with which they are associated. The tabs 20 are approximately one-half the thickness of the side panels 18 and are aligned so that their outer surfaces are coplanar with the outer surfaces of the side panels 18a and 18c with which they are integral. Since the tabs 20 are thinner than the side panels 18a and 18c, the side panels are formed with steps 25 (FIG. 4) that serve as the interface between the panels and the tabs. Each tab 20 is formed to define a lower edge 24 that is parallel and slightly spaced away from the longitudinal edge of the side panel 18a or 18c with which it is associated, an intermediate edge 26 that extends diagonally away from the lower edge 24, and a longitudinal edge 28 that is parallel to the longitudinal edge of the associated side panel 18a or 18c. Each tab 20 is further formed with an inwardly extending pin 30 that has an outer surface substantially coplanar with the surface of the side panel 18a or 18c with which the tab is associated. In the illustrated version of the invention, the pins 30 are shown as having a circular profile. This is merely exemplary and it should be understood that in other versions of the invention the pins 30 may be in the form of a polygon, a semicircle, or any other convenient shape.

The cutouts 22 are formed adjacent the longitudinal edges of side panels 18b and 18d. The cutouts 22 have a depth equal to the thickness of the adjacent tabs 20 and have a profile identical to that defined by tab edges 24, 26, and 28. The portion of each side panel 18b and 18d that defines a cutout further defines an opening 32 positioned and dimensioned to accommodate a pin 30 therein. The metal sheet 23 is also formed with a set of channels 34 as depicted in FIG. 4 that define the lines along which the sheet is bent to form the side panels 18.

The box body 12 of this invention is formed by initially forming metal sheet 23 so that it has the desired sections. In one preferred method of manufacture, both sides of a sheet of metal are simultaneously etched to form the base panel 16, the side panels 18, the tabs 20, the cutouts 22, the openings 32, and the channels 34. At the same time, the opposed sides of the metal are selectively etched to form the cutouts 22 and channels 34 and to reduce the thickness of the tabs 20 to the desired size. During this etching process portions of tabs 20 are not etched in order to form the pins 30. In many etching processes it is desirable to plan the etching to overetch the metal sheet 23 in order to compensate for the underetching that typically occurs in these processes. This means it is necessary to plan the etching to produce tabs 20 that are thinner than desired, cutouts 22 that are deeper then desired, and channels 34 that have a depth equal to approximately 56% of the thickness of the metal sheet and a width equal to approximately 112% of the thickness of the metal sheet. Such overetching would, of course, not be required in etching processes wherein the metal is etched away from the surface of the metal sheet 23 at a uniform rate along the sheet and at a rate that could readily be controlled.

Figure 5:
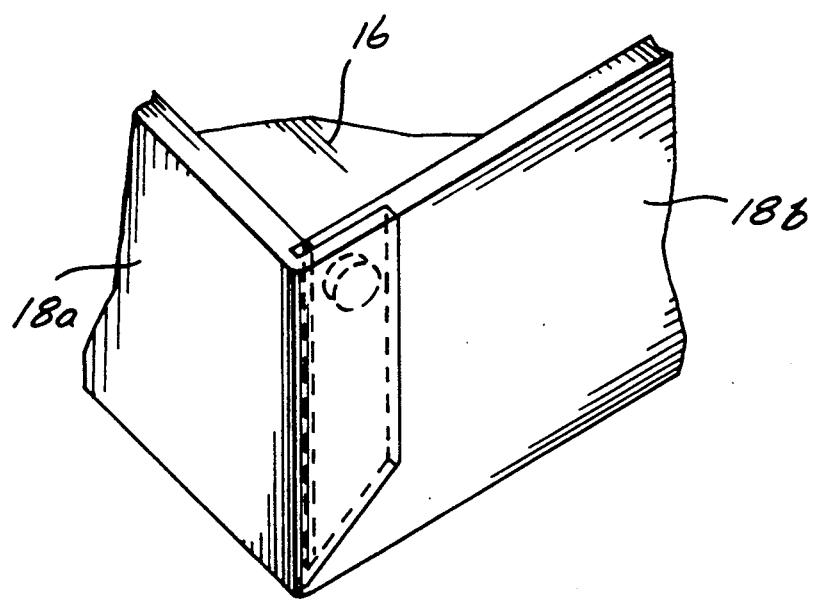
FIG. 5 is a detailed view of a corner of the box body of this invention.
Figure 1:
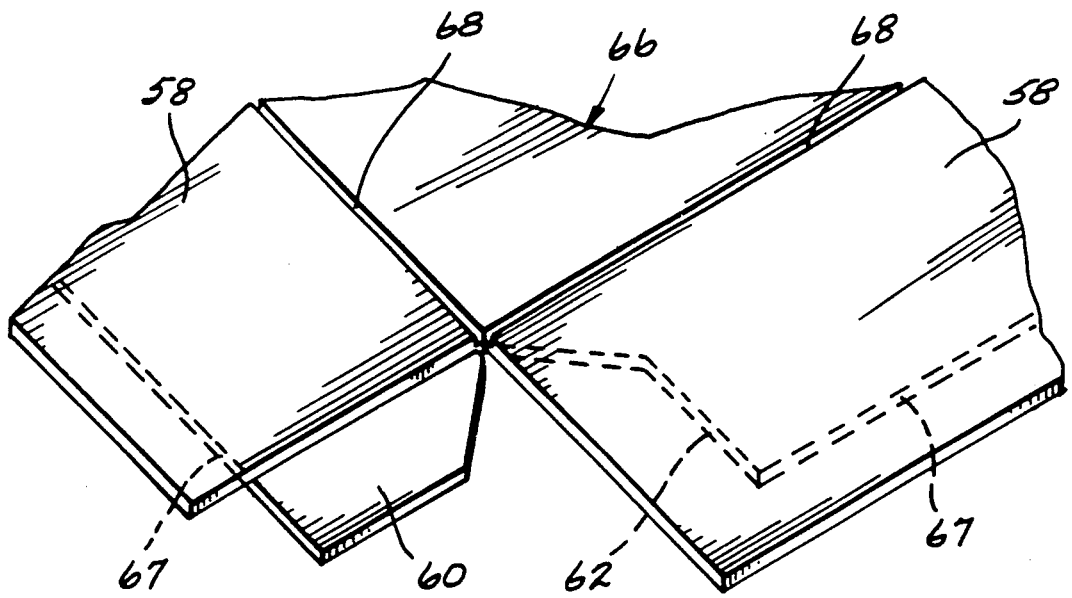

Once the metal sheet 23 is shaped and dimensioned, it is bent into the shape to form box body 12. First, sides 18b and 18c are bent upward along the channels 34. Side panels 18a and 18c are then bent upward in a similar fashion. The folds defined by the channels 34 minimize the effort required to fold the metal sheet 23 into shape and give the edges of the box body 12 a relatively sharp profile. The tabs 20 are then wrapped around the longitudinal edges of the adjacent side panels 18b and 18d to be seated in the cutouts 22 and so that the pins 30 are seated in the complementary pin openings 32 to lock the tabs in place. As a consequence of the wrapping of the tabs around the side panels, as illustrated by FIG. 5, the longitudinal edges of the side panels are compression locked between the adjacent side panel steps 25 and the inside surface of the tabs 20. The seating of the tabs 20 in the cutouts 22 completes the assembly of box body 12.

The box lid 14 of box assembly 10 of this invention has the same general construction as the box body 12 and is formed in the same general manner as the box body. The lid 14 has a top panel 42 from which four downwardly extending side panels 44 extend. The lid 44 is dimensioned so that the top panel 42 extends over the box body side panels 18 and so that the lid side panels 44 extend around the outer surface of the body side panels. The side panels that extend along the width of the box, panel 44a in FIG. 1, are provided with tabs 46 that wrap around the edges of the adjacent side panels 44, panel 44b in FIG. 1. The tabs 46 are seated in complementary cutouts 48 formed in the adjacent side panels 44. The lid tabs 46 and cutouts 48 are substantially identical to the construction of the box body tabs and cutouts, 20 and 22, respectively. The lid 14 is formed according to the same process by which the box body 12 is formed. Initially, a sheet of metal forming the lid 14 is subjected to a selective etching process to form the tabs to provide both the tabs 46 and cutouts 48 with the desired dimensions. Also, during the etching process, the tabs 46 may be formed with pins and the adjacent side panels may be formed with complementary openings to accommodate the pins. In other versions of the invention, the mechanical strength of the metal sheet from which lid 14 is formed may be sufficient to hold side panels 44 in place. Generally, if the side panels 44 have a length equal to less than 20 times the thickness of the metal sheet form which they are formed, and more particularly equal to 15 times or less the thickness of the sheet, the mechanical strength of the metal is sufficient to hold the panels in place. The sheet of metal is then bent into shape to form the lid 14.

The box body tabs 20 of the box 10 of this invention wrap completely around the edges of the side panels 18b and 18c with which they are associated. The tabs themselves are seated in cutouts 22 formed in the adjacent side panels 18b and 18d. Consequently, the box body 12 of this invention does not have seams either where the opposed edges of the side panels form the body's corners or where the tabs interface with the adjacent side panels 18b and 18d. Moreover, the tabs 20 and 46 are seated in cutouts 22 and 48, respectively, that have a depth equal to the tabs' thickness. Thus, neither the box body 12 nor the lid 14 has any outwardly extending bulges where the tabs overlap the adjacent side panels. When the lid 14 is fitted over the body 12 a tight fit is established between the planar outer surfaces of the body side panels 18 and the planar inner surfaces of the lid side panels 44. The assembled box 10 of this invention thus serves as a shielded enclosure that prevents RF waves, gas, or like contaminants from either entering or leaving the box.

The sides, bottom, and top of this box 10 have a thickness equal to a single layer of sheet metal from which the box is formed. Consequently, this box, though shielded, does not weigh appreciably more than conventional boxes. Furthermore, the body 12 of this box 10 is manufactured from a single sheet of metal; it does not require any additional components that add to its cost of manufacture. Still another advantage of the box of this invention is that it can be assembled using conventional manufacturing processes. Thus, the shielded box 10 of this invention can be provided at costs comparable to those associated with manufacturing conventional enclosures.

Figure 6:
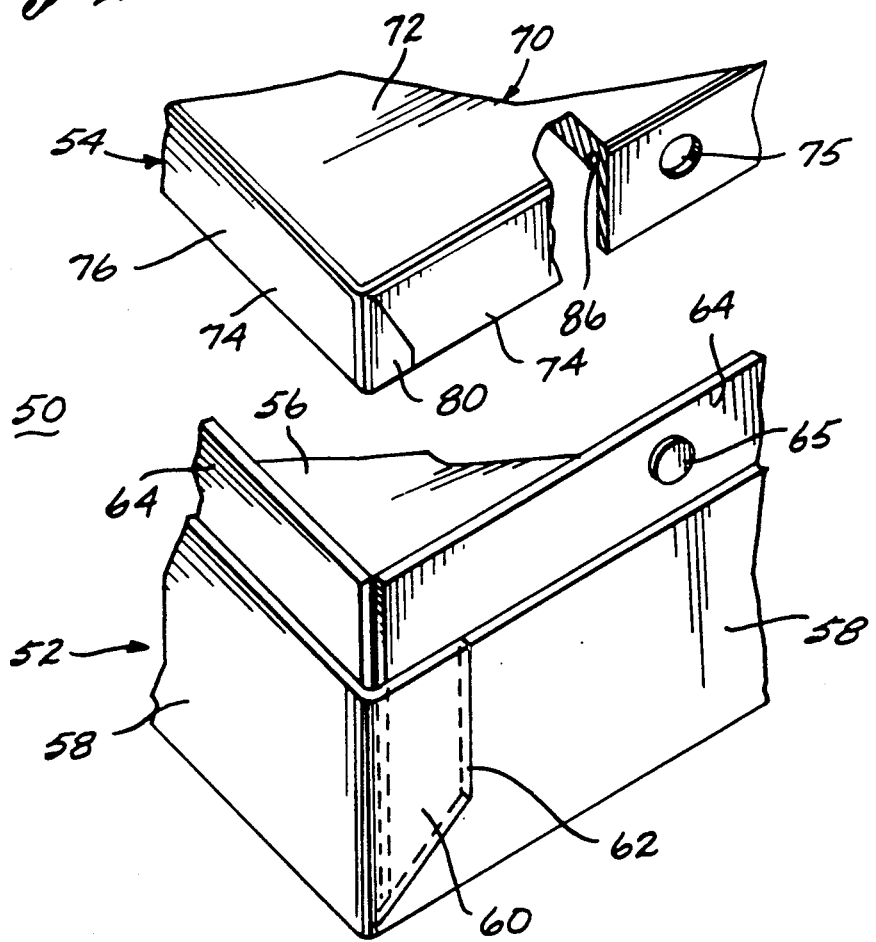
FIG. 6 is a perspective view of a corner section of an alternative box of this invention.

An alternative box 50 of this invention, illustrated by FIG. 6, includes a generally rectangular box body 52 and a lid 54 that is configured to be sealingly secured to the top of the body. Box body 52 includes a base panel 56 and a number of upwardly extending side panels 58. The side panels 58 are formed with tabs 60 and cutouts 62 similar to the previously described tabs and cutouts, 20 and 22, respectively, (FIG. 1). The side panels 58 are further formed with lips 64 that extend upward from the edges of the panels. The lips 64 have a thickness that is approximately one-half the thickness of the side panels. Lips 64 are further formed to have outwardly extending pins 65 that have a thickness equal to that of the side panels 58. As seen best by FIG. 7, the box body is formed from a single metal sheet 66. The base panel 56 and side panels 58 have a thickness equal to that of the metal sheet 66; the tabs 58 and lips 64 have a thickness equal to approximately half that of the metal sheet. The metal sheet 66 is shaped so that the inside surface of the lips 64 is coplanar with the inside surface of the side panels 58 with which they are associated. Step surfaces 67 extend perpendicularly between the outer surfaces of the side panels and the outer surfaces of the lips 64. Metal sheet 66 is further shaped so that the outer surface of the lips 64 associated with the side panels 58 that define the cutouts 62 are coplanar with the portions of the panels that define the cutouts. The metal sheet 66 is further formed with channels 68 between the base panel 56 and the side panels 58 to facilitate the bending of the metal in order to form the box body 52.

Figure 8:
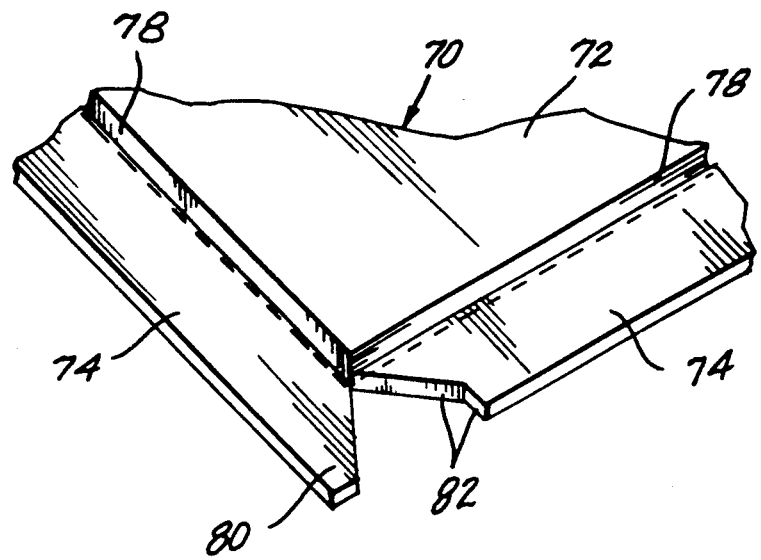
FIG. 8 is a perspective view of an unfolded sheet of metal used to form the box lid of FIG. 6, wherein this view depicts the side of the metal sheet that forms the inner surfaces of the box lid.

The box lid 54, as depicted by FIGS. 6 and 8, is formed from a metal sheet 70 so as to have a top panel 72 and side panels 74 that form a skirt 76 that fits around the box body lips 64. The top panel 72 has a thickness equal to that of the metal sheet 70; the side panels have a thickness equal to apoproximately one-half that of the metal sheet. Step surfaces 78 extend perpendicularly between the top panel 72 and the side panels 74. The lid side panels 74 define openings 75 that are dimensioned to accommodate the body lip pins 65. The lid side panels 74 are further formed so that, at the corners where adjacent panels meet, one panel 74 has a tab 80. The other side panel 74 is provided with edges 82 that define a tab space 84 in which the tab 80 can be seated.

Figure 9:
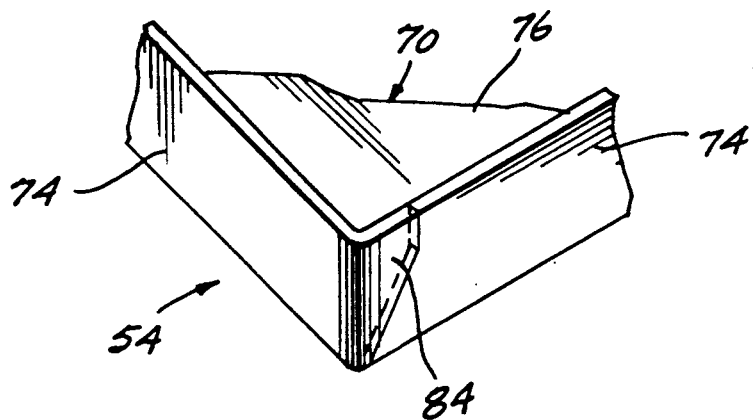
FIG. 9 is a perspective view of the box lid of FIG. 7, wherein the lid is depicted in the inverted state.

As illustrated by FIGS. 6 and 9, when the metal sheet 70 forming the box lid 54 is bent into shape, the outer portions of the sheet that define the side panels 74 are bent along lines slightly outward of the step surfaces 78 so as to define channels 86, one shown, between the interior surface of the top panel 72 and the side panel. Also, during the bending of the metal sheet 70, the tabs 80 are bent to form a butt joint against the edges 82 of the adjacent side panels 74. When the lid 54 is fitted over the box body 52, the inside surface of the lid side panels 74 is disposed against the outside surface of the box body lips 64. The top edges of the lips 64 are fitted into the channels 86 defined in the lid 54. The lid pins 65 are seated in the complementary lid openings 75 to secure the lid 54 to the body 52. Alternatively, solder can be flowed between the box body step surfaces 67 and the bottom edges of the lid side pannels 74 to secure the two parts of the box 50 together.

When box 50 of this embodiment of the invention is assembled, the outer surfaces of the lid skirt 76 are flush with the outer surfaces of the body side panels 58. The box body lips 64 form a barrier against the passage of contaminants into or out of the box 50 along the interface wherein the lid 54 is fitted over the box body 52. Box 50, thus forms a shielded enclosure even though it is structurally formed of metal a single thickness thick and does not have any outwardly extending bulges even in the regions where the body and lid overlap. This latter feature of box 50 of this invention makes it possible to place the box against a planar surface, such as a second box 50, and not have any interstitial space between the boxes equal to the width of the typically present body-lid overlap bulge. Still another feature of box 50 is that it eliminates the weight and excess metal associated with the body-lid overlap bulge.

Figure 10:
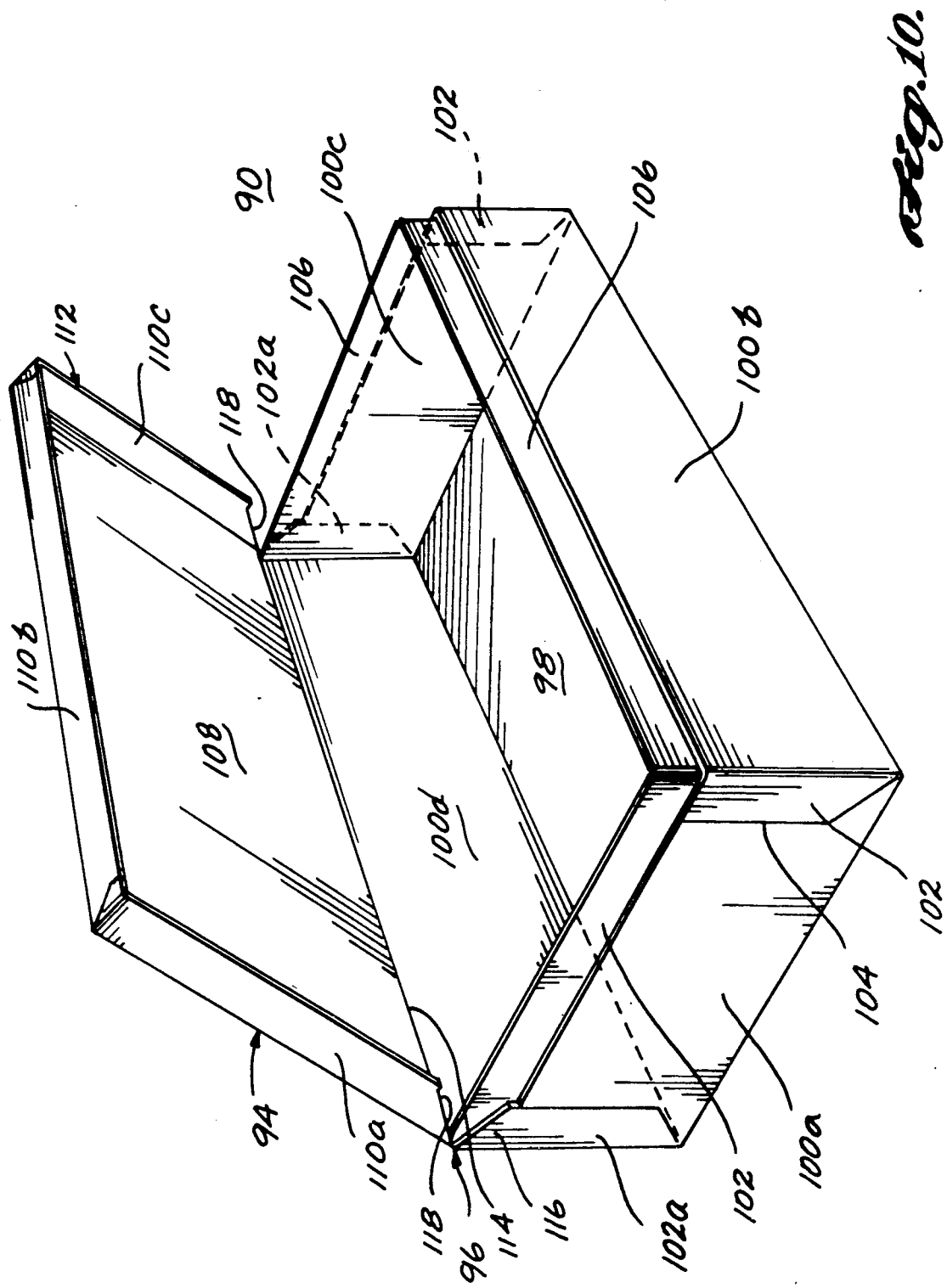
FIG. 10 is a perspective view of another alternative box of this invention wherein the box body and lid are formed from a single sheet of metal.

FIGS. 10 and 11 depict another alternative box 90 of this invention with a body 92 and lid 94 that are formed from a single piece of metal 96. The body of box 90 is approximately the same as the body 52 of previously described box 50 (FIG. 6). The body includes a base panel 98, and four upwardly extending side panels 100a–100d. Side panels 100a–100d are formed with tabs 102 that are dimensioned to be seated in cutouts 104 formed in the complementary side panels. Three of the side panels 100a–100c are provided with upwardly extending lips 106 that have a thickness equal to approximately one-half that of the side panels. Lid 94 includes a top section 108 and three downwardly extending side panels 110a–110c. Lid side panels 110a–110c collectively form a lid skirt 112 that is fitted against the lips 106 of body side panels 100a–100c.

Metal sheet 96 is shaped so that lid top 108 is integrally joined to the top edge of body side panel 100d. A channel 114, represented by a single line, separates the lid 94 from the body 92 and facilitates the bending of the lid over the body. The metal sheet 96 is further shaped so that the tabs 102a that extend out from side panel 100d are formed with extensions 116 adjacent the top of the box body 92. When the tabs 102a are wrapped around the lateral edges of the adjacent side panels 100a and 100c, the extensions 116 are disposed against the outer surfaces of the adjacent side panel lips 106. The lid side panels 110 adjacent tabs 102a are formed with edges 118 that define tab spaces in which the tabs are seated. When the lid 94 is closed over the box body 92, the tabs 102a form butt joints with the adjacent lid side panels 110a and 110c. The lips 106 associated with side panels 100a and 100c function as barriers adjacent the tab-lip side panel butt joints.

Box 90 offers the advantages of the previously described boxes of this invention. It serves as a sealed enclosure that is formed of only a single thickness of metal and does not have any outwardly extending bulges that either detract from its appearance or increase the overall space that it occupies. Moreover, lid 94 is never separated from box body 92. Since lid 94 is securely attached along one side to the box body 94, only minimal additional fastening means are required to keep the lid in place and the box closed. For example, in some versions of the invention, the only other additional fastening means that may be required would be a set of pin-and-hole fastening means formed in the body lip 106 and lid panel 110b opposite the interface between the lid and side panel 100d. An advantage of this assembly is that it would make it possible to reopen and reseal the box with a minimal amount of effort. In other versions of the invention, more permanent fastening of the lid 94 to the body 92 may be achieved by the application of a single line of solder to the body side panel 100b/lid side panel 110b interface.

It should be understood that the foregoing description is for the purposes of illustration only. It will be readily apparent that the invention can be practiced having diverse construction or an ultimate method of manufacture different from what has been described. For instance, while the disclosed boxes are rectangular, there is no requirement that all such boxes made according to this invention be similarly constructed. Triangular, hexagonal, octagonal, and other polygonal shapes of boxes may be manufactured. Also, it should further be understood that there is no requirement that the lid or other cover used with basic box body 12 of this invention be of the same general construction as the box body. In some versions of the invention, it may only be necessary to provide a flat sheet of metal as the lid. In other versions of the invention, the lid may be constructed to fit inside the box body.

It should similarly be understood that the pin-in-hole method disclosed for locking the side panels together is merely exemplary. In some versions of the invention, the pin may, for example, be located adjacent the upper edge of the side panel tab with which it is associated and a complementary hole may, in effect, be a slot defined in the adjacent side panel. In still other versions of the invention, the pin-in-hole locking assembly may either be eliminated or supplemented. In these versions of the invention, either spot welding or solder welding may be employed to seal the side panels 18 together. When solder welding is employed, the soldering process may involve initially placing a thin coat of solder on the surface of the tab 20 and/or the surface of the adjacent side panel 18 defining the complementary cutout 22 immediately after the metal sheet 23 is formed. Then, after the side panels 18 are folded together, heat is applied to the side panels 18 so as to cause the solder to flow and a bond to form between the two panels. In a similar vein, the tab itself may have a profile that differs from what has been disclosed in the illustrated version of the invention. For instance, in some versions of the invention, the tab may have rounded edges. In still other versions of the invention, the tab may have sections with either concave or convex profiles that lock into cutouts that have a complementary shape. Furthermore, there is no requirement that two tabs always be associated with one side panel. In other versions of the invention, each side panel may have a single tab associated therewith. Also, in some versions of the invention the cutouts may be formed along the inside surfaces of the side panels with which they are associated. In these versions of the invention the tabs would be concealed from view when looking at the outside of the box. It should also be understood that the box 10 of this invention can be formed of any metal, such as stainless steels, nickel-silver alloys, or brass alloys, that lends itself to a process by which the thickness of the tabs can be reduced and cutouts formed in the adjacent side panels. Furthermore, in some versions of the invention, it may be necessary or desirable to provide a box wherein only one or two of the corners have the tab-in-cutout assembly of this invention. The advantage of this structure is that the corners so provided would be sealed and would have a uniform thickness equal to the thickness of the metal sheet from which the box was formed. It should also be recognized that it is possible to fabricate a box of this invention wherein the body and lid are formed out of a single sheet of metal and a lip skirt is located inside the box body. In these versions of the invention, the body lips would be coplanar with the outer surface of the body side panels and the lid would have a step that would serve as a seal around the top of the box body. Therefore, it is the object of the appended claims to cover all such modifications and variations as come within the true spirit and scope of the invention.

The embodiments of the invention in which an exclusive property or privilege is claimed are defined as follows:

1. A box assembly comprising: a box body formed from a single sheet of metal having a selected thickness, said box body having a base panel, a plurality of side panels that extend upward from said base portion such that adjacent said side panels have adjacent longitudinally extending edges, and a tab extending from a selected said side panel longitudinally extending edge, wherein said tab has a thickness less than the thickness of the metal sheet, and a cutout formed in said side panel adjacent said side panel to which said tab is attached and said tab being seated in said cutout so that said tab and cutout form a corner of said box body that has a uniform thickness equal to the thickness of the metal sheet.

2. The box assembly of claim 14, further including a fastening means for locking said tab into said cutout.

3. The box assembly of claim 2, wherein said side panel to which said tab is connected has a step adjacent said tab and said adjacent panel is positioned so that said longitudinal edge of said adjacent side panel is secured between said tab and said side panel step.

4. The box assembly of claim 1, further including a plurality of said tabs extending from said side panel longitudinally extending edges and a plurality of said cutouts formed in said side panels adjacent said side panels with which said tabs are associated wherein said tabs are seated in said cutouts to form the corners of said box body so that said box body has a uniform thickness equal to the thickness of the metal sheet.

5. The box assembly of claim 4, further including a fastening means for locking said tabs into said cutouts.

6. The box assembly of claim 5, wherein said tabs are provided with inwardly extending pins and said side panels forming said cutouts are formed with openings coincident with said cutouts and wherein said openings are positioned so that said pins extend therethrough.

7. The box assembly of claim 6, wherein said pins are located in the center of said tabs and said side panel openings are in the form of holes located with said side panesl with which they are associated.

8. The box assembly of claim 5, wherein one of said tabs is formed with a lower edge that is parallel to the edge separating said side panel with which said tab is associated and said base panel, an intermediate edge extending upward from said lower edge, and a top longitudinal edge that extends from said intermediate edge toward the top of said tab.

9. The box assembly of claim 5, wherein said side panels with which said tabs are associated have a step adjacent said tabs and said adjacent panels are positioned so that said longitudinal edges of said adjacent side panels are secured between said tabs and said side panel steps.

10. A box body formed from a single sheet of metal having a selected thickness, comprising: a base panel; a plurality of side panels extending upward from said base panels, said side panels having longitudinally extending edges; a plurality of tab-in-cutout assemblies for securing said adjacent side panels together, each said tab-in-cutout assembly including a tab extending from a longitudinal edge of one of said side panels, said tab having a thickness less than the thickness of the metal sheet and a cutout formed in the other said side panel wherein said tab is seated in said cutout so that the box body has a substantially uniform thickness equal to the thickness of the metal sheet; and means for securing said tabs in said cutouts.

11. The box body of claim 10, wherein said tabs are provided with an inwardly extending pin and said side panels forming said cutouts are formed with openings coincident with said cutouts and wherein said openings are positioned so that said tab pins extend therethrough.

12. The box assembly of claim 10, wherein said side panels to which said tabs are connected have a step adjacent said tabs and said adjacent side panels are positioned so that said longitudinal edges of said adjacent side panels are secured between said tabs and said side panel steps.

13. A box assembly including:
a box body formed from a single sheet of metal having a selected thickness, comprising: a base panel; a plurality of side panels extending upward from said base panels, said side panels having longitudinally extending edges and laterally extending edges; lips extending upward from said side panels laterally extending edges, said lips having a thickness less than the thickness of the metal sheet; and a plurality of tab-in-cutout assemblies for securing said adjacent side panels together, each said tab-in-cutout assembly including a tab extending from a longitudinal edge of one of said side panels, said tab having a thickness less than the thickness of the metal sheet and a cutout formed in the other said side panel wherein said tab is seated in said cutout so that the box body has a substantially uniform thickness equal to the thickness of the metal sheet, and means for securing said tab in said cutout; and
a lid formed from a single sheet of metal having a thickens equal to the thickness of the sheet of metal from which said box body is formed, said lid having a top panel and a plurality of side panels that extend downwardly from said skirt, wherein said lid side panels have a thickness less than that of the lid metal sheet so that, when said lid is fitted to said box body, said lid side panels are adjacent said box body lips, and said box body has a uniform thickness equal to the thickness of the metal sheets.

14. The box body of claim 13, wherein said box body tabs are provided with an inwardly extending pin and side panels forming said cutouts are formed with openings coincident with said cutouts and wherein said openings are positioned so that said tab pins extend therethrough.

15. The box body claim 13, wherein said box body side panels to which said tabs are connected have a step adjacent said tabs and said adjacent side panels are positioned so that said longitudinal edges of said adjacent side panels are secured between said tabs and said side panel steps.

16. The box assembly of claim 13, wherein said box body and said box lid are formed from a single metal sheet.

17. A method of forming a box body according to the process of:
selectively forming a sheet of metal having a selected thickness so that said sheet of metal includes a base portion, a plurality of side portions that extend outward from said base portions such that said side portions have longitudinally extending edges, and a plurality of tabs extending from selected side panel longitudinally extending edges;
etching said tabs so that said tabs have a thickness less than the thickness of said metal sheet;
selectively etching cutouts in said side panels adjacent said side panels to which said tabs are attached, wherein said cutouts are etched in said side panels adjacent said longitudinal edges thereof and said cutouts have a depth equal to the thickness of said tabs;
bending said side panels upward so that said adjacent side panel longitudinal edges abut; and
bending said tabs around said side panel longitudinally extending edges so that said tabs are seated in said cutouts such that said side panels have a uniform thickness equal to the thickness of said metal sheet.

18. The method of forming a box body of claim 17, wherein the thickness of said tabs is reduced and said cutouts are formed in a single etching step.

19. The method of forming a box body of claim 17, further including the step of locking said tabs in said cutouts.

20. The method of forming a box body of claim 17, wherein said tabs are selectively etched so that each said tab is formed with an inwardly directed pin and forming an opening in said side panels in which said cutouts are formed, wherein said openings are positioned so that, when said tabs are seated in said cutouts, said tab pins extend through said openings.

21. The method of forming a box body of claim 17, further including the step of welding said tabs in said cutouts.

22. The method of forming a box body of claim 17, further including the step of soldering said tabs in said cutouts.

23. The method of assembly of claim 17, further including the step of forming channels in said metal sheet in said etching step wherein said channels define the edges between said box body base portion and said box body side portions.

24. The method of box assembly of claim 17, wherein said side panels are dimensioned so that, when said tabs are wrapped around said side panels adjacent thereto, said longitudinal edges of said adjacent side panels are disposed between said tabs and said side panels with which said tabs are associated.

* * * * *

UNITED STATES PATENT AND TRADEMARK OFFICE
CERTIFICATE OF CORRECTION

PATENT NO. : 5,195,644

DATED : March 23, 1993

INVENTOR(S) : H. Schmid

It is certified that error appears in the above-identified patent and that said Letters Patent is hereby corrected as shown below:

Column 3, line 44, after "box" insert --body--.
Column 5, line 15, "form" should read --from--.

Column 6, line 21, "apoproximately" should read --approximately--.
Column 7, line 36, "occupie..." should read --occupies--.
Column 9, line 6, claim 14, should read --Claim 1--.

Column 9, line 31, "pansel" should read --panels--.
Column 10, line 38, "body" should read --assembly of --.

Signed and Sealed this

First Day of February, 1994

Attest:

BRUCE LEHMAN

*Attesting Officer*     *Commissioner of Patents and Trademarks*